(12) United States Patent
Chen et al.

(10) Patent No.: US 10,333,028 B2
(45) Date of Patent: Jun. 25, 2019

(54) LIGHT-EMITTING DIODE CHIPS WITH ENHANCED BRIGHTNESS

(71) Applicant: Xiamen Changelight Co., Ltd., Xiamen, Fujian Province (CN)

(72) Inventors: Liang Chen, Xiamen (CN); Junxian Li, Xiamen (CN); Qimeng Lv, Xiamen (CN); Zhendong Wei, Xiamen (CN); Yingce Liu, Xiamen (CN); Xiaoping Li, Xiamen (CN); Xinmao Huang, Xiamen (CN); Kaixuan Chen, Xiamen (CN); Yong Zhang, Xiamen (CN); Zhiwei Lin, Xiamen (CN); Wei Jiang, Xiamen (CN); Xiangjing Zhuo, Xiamen (CN); Tianzu Fang, Xiamen (CN)

(73) Assignee: XIAMEN CHANGELIGHT CO., LTD., Xiamen (CN)

( * ) Notice: Subject to any disclaimer, the term of this patent is extended or adjusted under 35 U.S.C. 154(b) by 0 days.

(21) Appl. No.: 15/482,338

(22) Filed: Apr. 7, 2017

(65) Prior Publication Data

US 2017/0294557 A1    Oct. 12, 2017

(30) Foreign Application Priority Data

Apr. 7, 2016    (CN) .......................... 2016 1 0212121

(51) Int. Cl.
| | | |
|---|---|---|
| *H01L 33/14* | (2010.01) | |
| *H01L 33/00* | (2010.01) | |
| *H01L 33/06* | (2010.01) | |
| *H01L 33/32* | (2010.01) | |
| *H01L 33/38* | (2010.01) | |
| *H01L 33/62* | (2010.01) | |

(52) U.S. Cl.
CPC .......... *H01L 33/145* (2013.01); *H01L 33/007* (2013.01); *H01L 33/0075* (2013.01); *H01L 33/06* (2013.01); *H01L 33/32* (2013.01); *H01L 33/382* (2013.01); *H01L 33/62* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS 6,693,352 B1 * 2/2004 Huang .................. H01L 29/452
257/743
7,119,374 B2 * 10/2006 Hon ........................ H01L 33/14
257/94

(Continued)

*Primary Examiner* — Thao P Le
(74) *Attorney, Agent, or Firm* — Foley & Lardner LLP; Cliff Z. Liu

(57) ABSTRACT

According to at least some embodiments of the present disclosure, a light-emitting diode (LED) chip includes a semiconductor material portion, a transparent conductive layer disposed above the semiconductor material portion, a current blocking layer disposed above the transparent conductive layer, one or more electrodes disposed above the current blocking layer, and a plurality of electron outflow channels that electrically interconnect at least one electrode and the semiconductor material portion across the transparent conductive layer and the current blocking layer.

13 Claims, 7 Drawing Sheets

(56) References Cited

U.S. PATENT DOCUMENTS

| | | | | |
|---|---|---|---|---|
| 7,915,624 B2* | 3/2011 | Jorgenson | ............. | H01L 33/105 |
| | | | | 257/94 |
| 8,207,539 B2* | 6/2012 | Hsieh | ................. | H01L 33/0079 |
| | | | | 257/79 |
| 8,212,273 B2* | 7/2012 | McKenzie | ............. | H01L 33/20 |
| | | | | 257/98 |
| 8,969,897 B2* | 3/2015 | Choi | .................... | H01L 33/382 |
| | | | | 257/98 |
| 9,035,324 B2* | 5/2015 | Kim | .................... | H01L 27/156 |
| | | | | 257/13 |
| 9,269,698 B2* | 2/2016 | Zeng | ................... | H01L 25/0753 |
| 9,520,536 B2* | 12/2016 | Kim | ....................... | H01L 33/20 |
| 9,853,189 B2* | 12/2017 | Song | .................... | H01L 33/145 |
| 2012/0007118 A1* | 1/2012 | Choi | .................... | H01L 33/382 |
| | | | | 257/98 |

* cited by examiner

| 112 Transparent Conductive Layer |
| 110 P-doped Semiconductor Layer |
| 108 MQWS Layer |
| 106 N-doped Semiconductor Layer |
| 104 Undoped Semiconductor Layer |
| 102 Substrate |

FIG. 2A

LIGHT-EMITTING DIODE CHIPS WITH ENHANCED BRIGHTNESS

CROSS-REFERENCE TO RELATED APPLICATIONS

This application claims priority to Chinese Patent Application 201610212121.1, filed Apr. 7, 2016, which is incorporated herein by reference in its entirety.

BACKGROUND

Conventional face-up light-emitting diode (LED) chips (also referred to as planar LED chips) include current blocking layers (CBLs) inserted underneath the electrodes (e.g., p-side electrode pads) for reducing parasitic optical absorption in the electrodes. However, the current blocking layers cause increased driving voltages for operating the LED chips and reduces the light-emitting efficiencies.

SUMMARY

In an aspect according to some embodiments of the present disclosure, a light-emitting diode (LED) chip includes a semiconductor material portion; a transparent conductive layer disposed above the semiconductor material portion; a current blocking layer disposed above the transparent conductive layer; one or more electrodes disposed above the current blocking layer; and a plurality of electron outflow channels that electrically interconnect at least one electrode and the semiconductor material portion across the transparent conductive layer and the current blocking layer.

In another aspect according to some embodiments of the present disclosure, a method of fabricating a light-emitting diode (LED) chip includes: depositing a semiconductor material portion above a substrate; depositing a transparent conductive layer above the semiconductor material portion and a current blocking layer disposed above the transparent conductive layer; creating a plurality of electron flow channels across at least the current blocking layer; and depositing one or more electrodes and filling the electron flow channels with at least one conductive material such that the electron flow channels electrically interconnect at least one electrode and the semiconductor material portion across the current blocking layer.

In yet another aspect according to some embodiments of the present disclosure, a face-up (or planar) light-emitting diode (LED) chip include an n-doped semiconductor layer; a multiple quantum wells (MQWS) layer disposed above the n-doped semiconductor layer; a p-doped semiconductor layer disposed above the MQWS layer; a transparent conductive layer disposed above the p-doped semiconductor layer; a current blocking layer disposed above the transparent conductive layer; at least one p-side electrode and at least one n-side electrode disposed above the current blocking layer; one or more p-electrode inflow channels that electrically interconnect the at least one p-side electrode and the transparent conductive layer, across the current blocking layer; and one or more n-electrode outflow channels that electrically interconnect at least one n-side electrode and the n-doped semiconductor layer, across the transparent conductive layer, the current blocking layer, the p-doped semiconductor layer, and the MQWS layer.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 2A schematically illustrates a stage of fabrication of an LED chip prior to formation of inflow or outflow channels, according to various embodiments of the present disclosure.

DETAILED DESCRIPTION

A conventional face-up LED chip includes a current blocking layer (CBL) inserted underneath the p-side electrode pad. Due to lack of electron inflow, the multiple quantum wells (MQWs) underneath the CBL cannot be effectively activated. In addition, the n-side electrode pad is in direct contact with the n-doped semiconductor layer. The multiple quantum wells in proximity to the n-type electrode pads and fingers cannot be effectively utilized because these multiple quantum wells are etched away by an inductively coupled plasma (ICP) etching process.

Described in at least some embodiments of the present disclosure are an LED chip (e.g., a GaN (gallium nitride) LED chip) with enhanced brightness and manufacturing of the LED chip. An epitaxial layer and a transparent conductive layer are formed on the same side of a substrate. A current blocking layer is formed on the transparent conductive layer by, e.g., vapor deposition. Under the area of the n-electrode (e.g., n-electrode pad(s) and/or n-electrode finger(s)), a plurality of n-electrode outflow channels are formed from the n-doped semiconductor layer to the transparent conductive layer. The n-electrode outflow channels may be, e.g., evenly distributed. Under the area of the p-electrode (e.g., p-electrode pad(s) and/or p-electrode finger(s)), a plurality of p-electrode inflow channels are formed from the current blocking layer to the transparent conductive layer. The p-electrode inflow channels may be, e.g., evenly distributed. The LED chip specifies a reduced operating voltage and an enhanced brightness.

In some embodiments, comparing to a conventional LED chip without inflow and outflow channels operated by the same amount of electric current, a LED chip with inflow channels and/or outflow channels according to some embodiments of the present disclosure may operate at a voltage that is at least about 0.1%, at least about 0.5%, at least about 1%, at least about 2%, at least about 5%, or at least about 10% less than the operating voltage of the conventional LED chip. In some embodiments, comparing to a conventional LED chip without inflow and outflow channels operated by the same amount of electric current, a LED chip with inflow channels and/or outflow channels according to some embodiments of the present disclosure may achieve a brightness that is at least about 0.1%, at least about 0.5%, at least about 1%, at least about 2%, at least about 5%, or at least about 10% more than the brightness of the conventional LED chip.

Figure 1:
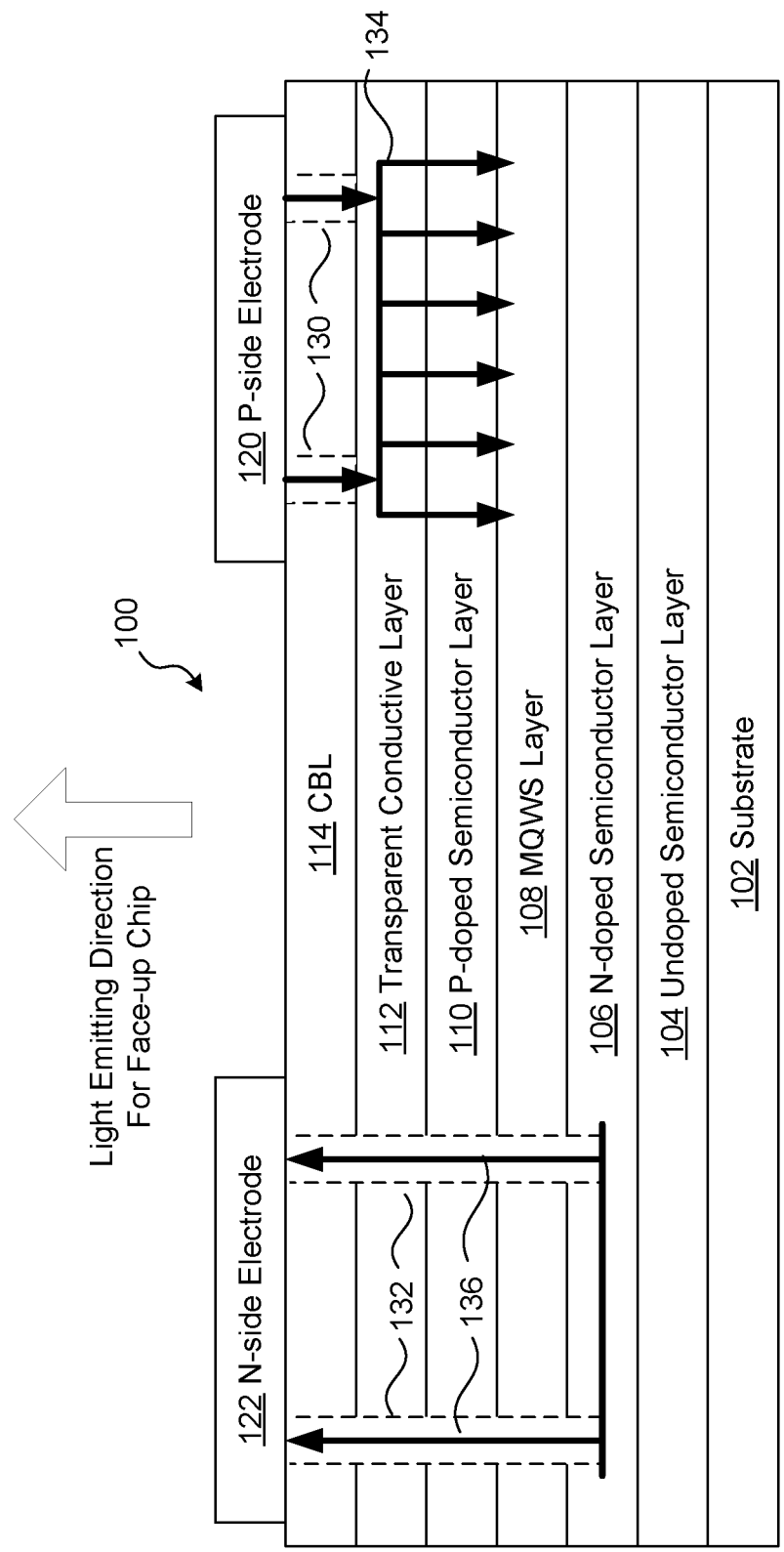
FIG. 1 schematically illustrates a cross-section of an example of an LED chip, according to various embodiments of the present disclosure.

FIG. 1 schematically illustrates a cross-section of an example of an LED chip according to some embodiments of the present disclosure. The LED chip 100 includes a substrate 102. The substrate 102 may be formed of, or include, e.g., silicon carbide (SiC), sapphire ($Al_2O_3$), zinc oxide (ZnO), or silicon (Si). On top of the substrate 102, the LED chip 100 further includes an undoped semiconductor layer 104, an n-doped semiconductor layer 106 (also referred to as n-type semiconductor layer), a multiple quantum wells (MQWS) layer 108, a p-doped semiconductor layer 110 (also referred to as p-type semiconductor layer), a transparent conductive layer 112, and a current blocking layer (CBL) 114. The undoped semiconductor layer 104, the n-doped semiconductor layer 106, the MQWS layer 108 and the p-doped semiconductor layer 110 may be collectively called semiconductor material portion.

The LED chip 100 may include, e.g., gallium nitride (GaN) in the semiconductor layers. In some other embodiments, the LED chip may include other types of semiconductor materials. In some embodiments, the transparent conductive layer 112 may be formed of, or at least include transparent conductive material(s) such as indium tin oxide (ITO). In some embodiments, the CBL 100 may be formed of, or at least include, nonconductive material(s) such as silicon dioxide ($SiO_2$). In some embodiments, the CBL 100 may be transparent or translucent.

In some embodiments, the MQWS layer 108 include layers of different semiconductor materials grown on top of each other. For example, the MQWS layer 108 may include alternating sub-layers of gallium nitride (GaN) and indium gallium nitride (InGaN) respectively to create the quantum well effects.

In some embodiments, in a face-up (planar) LED chip, the light generated from the semiconductor layers (e.g., n-doped semiconductor layer 106, multiple quantum wells (MQWS) layer 108, p-doped semiconductor layer 110) propagates through the transparent conductive layer 112 and out of the LED chip 100. In some embodiments, the substrate 102 may include a reflective surface (or the LED chip 100 may include a reflective material (e.g., Ag) above or underneath the substrate 102) such that light propagating downwards is reflected by the substrate 102 and then propagate through the transparent conductive layer 112 and out of the LED chip 100. In some other embodiments, for a flip chip design, the transparent conductive layer 112 may be replaced by a layer of non-transparent conductive material (e.g., Ag).

On top of the CBL 114, the LED chip 100 includes a p-side electrode 120 and an n-side electrode 122. In some embodiments, the CBL 114 may not cover the entire surface of the transparent conductive layer 112. In some embodiments, the CBL 114 may cover the area underneath electrodes (e.g., p-side electrode 120 and n-side electrode 122).

In some embodiments, the p-side electrode 120 may include one or more p-side electrode pads. The p-side electrode 120 may further include one or more p-side electrode fingers as extension of the p-side electrode pads. The fingers are also referred to as extension strips. Similarly, the n-side electrode 120 may include one or more n-side electrode pads. The n-side electrode 120 may further include one or more n-side electrode fingers as extension of the n-side electrode pads.

In the area underneath the p-side electrode 120, there are a plurality of p-electrode inflow channels 130 disposed in the CBL 114. The p-electrode inflow channels 130 may be evenly distributed in the area underneath the p-side electrode. The p-electrode inflow channels 130 may be filled with, or at least include, e.g., one or more conductive materials such as gold (Au), aluminum (Al), titanium (Ti), platinum (Pt), chromium (Cr), cadmium (Cd), copper (Cu), etc. In some embodiments, the p-electrode inflow channels 130 may be in direct contact with the transparent conductive layer 112 as illustrated in FIG. 1. In some embodiments, the p-electrode inflow channels 130 may extend into the transparent conductive layer 112. The p-electrode inflow channels 130 electrically interconnect the transparent conductive layer 112 and the p-side electrode 120 through the CBL 114.

The p-electrode inflow channels 130 provide conductive paths for the electrons (as illustrated as electric currents 134 in FIG. 1) to directly flow from the p-side electrode 120 to the transparent conductive layer 112, via the channels 130 across the CBL 114. The transparent conductive layer 112 further spreads the electric currents 134 from the p-electrode inflow channels 130. The spread currents 134 further flow to the p-doped semiconductor layer 110 and the MQWS layer 108, and activate the multiple quantum wells located in an area (or areas) directly underneath the p-side electrode 120.

In the area underneath the n-side electrode 122, there are a plurality of n-electrode outflow channels 132 disposed in the MQWS layer 108, the p-doped semiconductor layer 110, the transparent conductive layer 112 and the CBL 114. The n-electrode outflow channels 132 may be evenly distributed in the area underneath the n-side electrode. The n-electrode outflow channels 132 may be filled with, or at least include, one or more conductive materials such as gold (Au), aluminum (Al), titanium (Ti), platinum (Pt), chromium (Cr), cadmium (Cd), copper (Cu), etc. In some embodiments, the n-electrode outflow channels 132 may be in direct contact with the n-doped semiconductor layer 106. In some embodiments, the n-electrode outflow channels 132 may extend into the n-doped semiconductor layer 106 as illustrated in FIG. 1. The n-electrode outflow channels 132 electrically interconnect the n-doped semiconductor layer 106 and the n-side electrode 122 through the CBL 114, through the MQWS layer 108, the p-doped semiconductor layer 110, the transparent conductive layer 112 and the CBL 114.

The n-electrode outflow channels 132 provide conductive paths for the electrons (as illustrated as electric currents 136 in FIG. 1) to directly flow from the n-doped semiconductor layer 106 to the n-side electrode 122, via the channels 132 across the MQWS layer 108, the p-doped semiconductor layer 110, the transparent conductive layer 112 and the CBL 114. The currents 136 activate the multiple quantum wells located in an area (or areas) directly underneath the n-side electrode 122.

Therefore, the p-electrode inflow channels 130 and the n-electrode outflow channels 132 provide electron-flowing channels between the electrodes 120, 122 and the semiconductor layers, and active the multiple quantum wells located in areas directly underneath the p-side electrode 120 and the n-side electrode 122. As a result, the activated multiple quantum wells located in the areas underneath the electrode contribute emitting light and enhance the overall brightness of the LED chip 100. Comparing to LED chips with the same size and without the inflow and outflow channels, the LED chip 100 specifies a lower current density for driving the LED chip and reduces a droop effect, where the LED chip's efficiency declines as the current passing through the LED chip increases. Thus, the LED chip 100 specifies a reduced voltage for driving the LED chip and enhance the brightness of the chip.

Although various examples described and illustrated herein disclose that the chips include semiconductor materials (undoped, n-doped, or p-doped semiconductors) such as gallium nitride (GaN), it is to be understood that the technology disclosed herein may be applied to chips including other types of semiconductor materials, such as aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). In other words, the semiconductor material may be formed of, or at least include, e.g., a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

Although various examples described and illustrated herein may refer to specific packaging types of LED chips, such as face-up LED chips or planar LED chips, it is to be understood that the technology disclosed herein may be applied to other types of LED chips, such as flip chips or vertical chips. Although various examples described and illustrated herein may refer to LED chips, it is to be understood that the technology disclosed herein may be applied to other types of semiconductor chips, such photovoltaic chips, analog integrated chips or digital integrated chips.

Figure 2B:
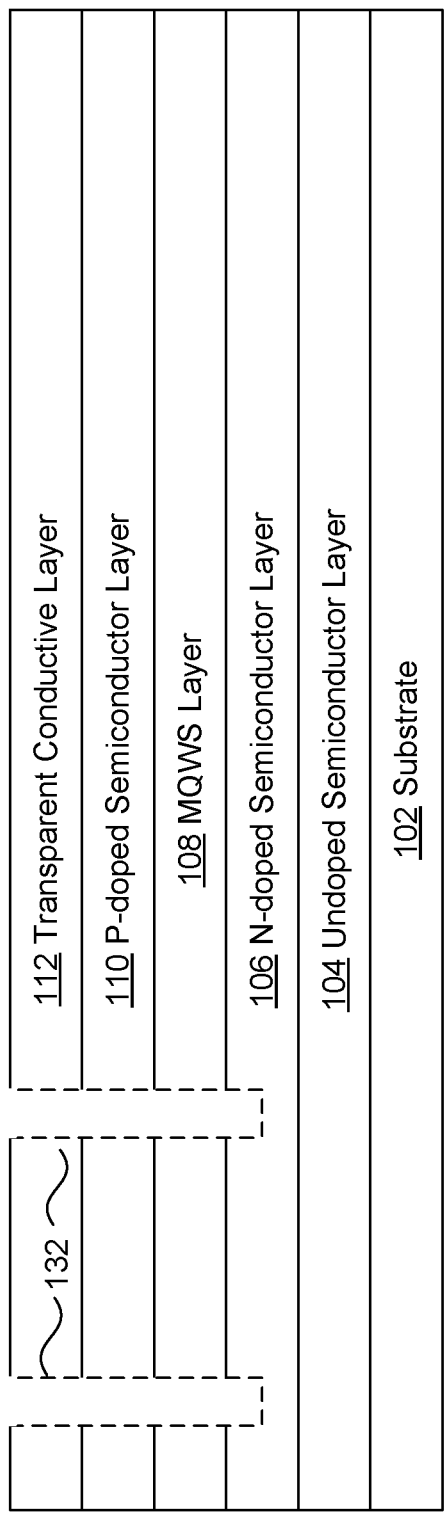
FIG. 2B schematically illustrates a stage of fabrication of an LED chip after formation of n-electrode outflow channels, according to various embodiments of the present disclosure.

FIGS. 2A-2E illustrates an example of an LED chip during various stages of a fabrication process, according to at least some embodiments of the present disclosure. During the fabrication process, various semiconductor layers are fabricated on a substrate. As illustrated in FIG. 2A, an undoped semiconductor layer 104, an n-doped semiconductor layer 106, a multiple quantum wells (MQWS) layer 108, a p-doped semiconductor layer 110 are formed on top of the substrate 102. A transparent conductive layer (e.g., ITO) 112 is further formed on the p-doped semiconductor layer 110 by, e.g., vapor deposition.

As illustrated in FIG. 2B, a plurality of n-electrode outflow channels 132 are formed across the MQWS layer 108, the p-doped semiconductor layer 110 and the transparent conductive layer 112. The n-electrode outflow channels 132 may be fabricated by, e.g., etching away some materials from the MQWS layer 108, the p-doped semiconductor layer 110 and the transparent conductive layer 112. The locations of the n-electrode outflow channels 132 may be evenly distributed along the designed pads and/or fingers of the n-side electrode 122. In some embodiments, the n-electrode outflow channels 132 may be in direct contact with the n-doped semiconductor layer 106. In some embodiments, the n-electrode outflow channels 132 may extend into the n-doped semiconductor layer 106.

It is to be understood that the term "design" or "designed" (e.g., as used in "designed electrodes," "designed pads," "designed fingers" or other phrases herein) refers to parameters set during a design phase; which parameters after fabrication may have an associated tolerance.

Figure 2C:
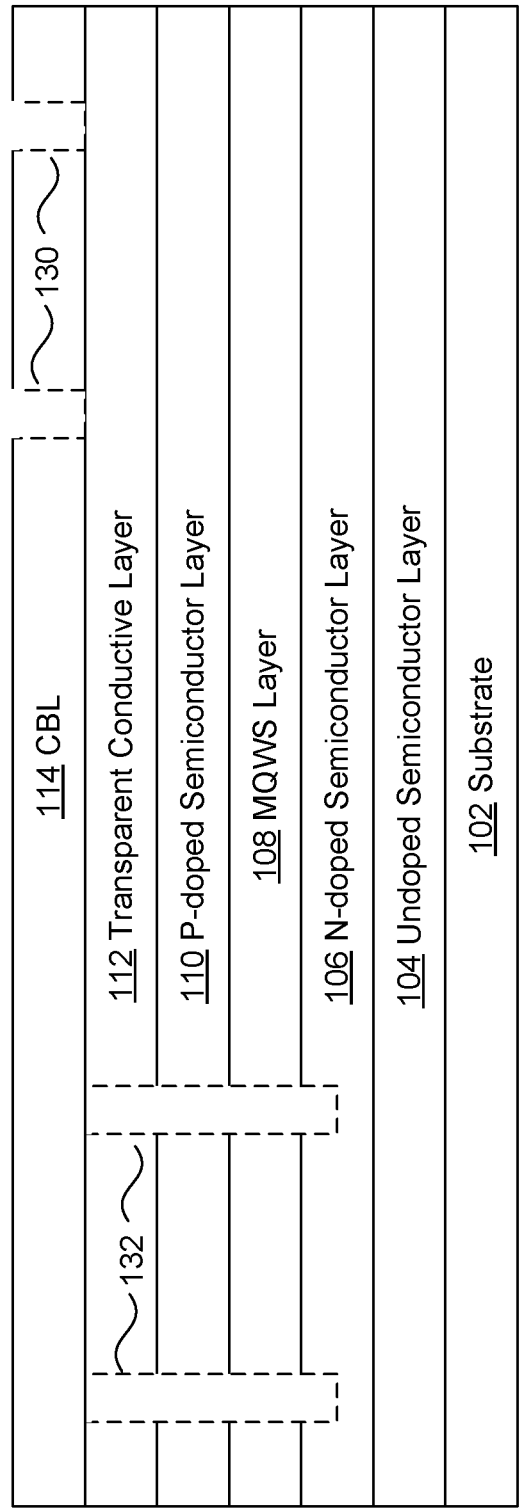
FIG. 2C schematically illustrates a stage of fabrication of an LED chip after formation of a current blocking layer, according to various embodiments of the present disclosure.

As illustrated in FIG. 2C, a CBL 114 is formed on the transparent conductive layer 112 by, e.g., vapor deposition. In some embodiments, the CBL 114 may cover a portion of or the entire top surface of the transparent conductive layer 112. For example, the CBL 114 may cover an area that is underneath, or in proximity to, where the electrodes are to be disposed. In some embodiments, some materials of the CBL 114 (e.g., $SiO_2$) may cover or fill the n-electrode outflow channels 132.

A plurality of p-electrode inflow channels 130 are further formed across the CBL 114. The p-electrode inflow channels 130 may be fabricated by, e.g., etching away some materials from the CBL 114. The locations of the p-electrode inflow channels 130 may be evenly distributed along the designed pads and/or fingers of the p-side electrode 120. In some embodiments, the p-electrode inflow channels 130 may be in direct contact with the transparent conductive layer 112. In some embodiments, the p-electrode inflow channels 130 may extend into the transparent conductive layer 112.

Figure 2D:
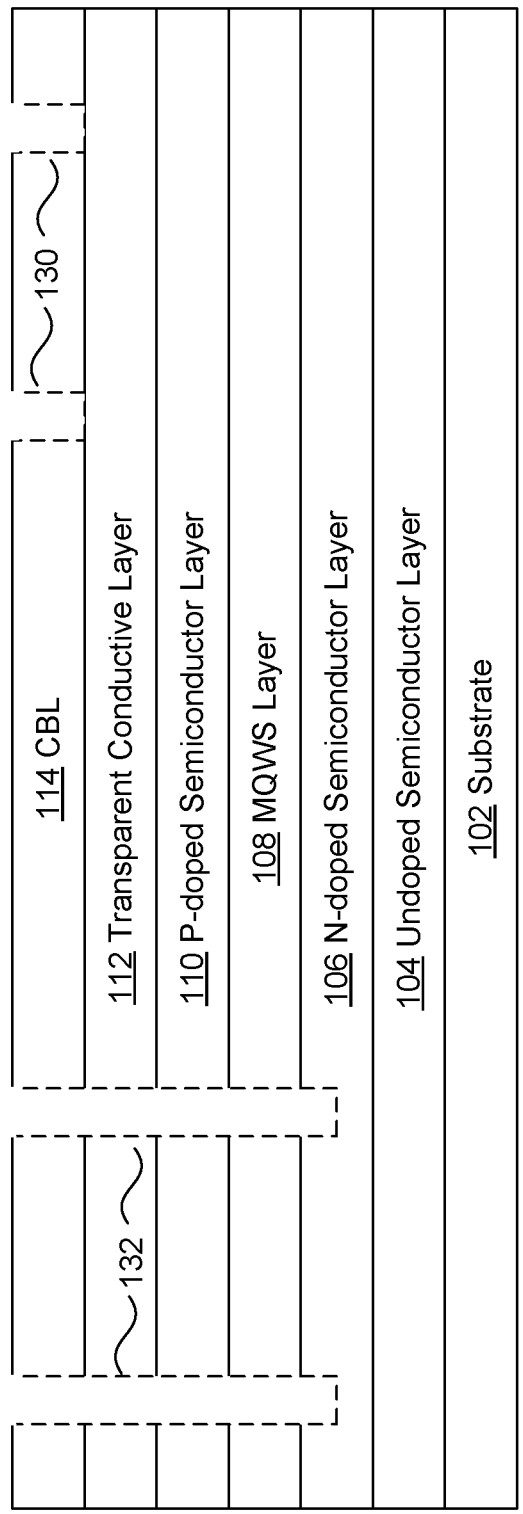
FIG. 2D schematically illustrates a stage of fabrication of an LED chip after removal of some materials of the current blocking layer, according to various embodiments of the present disclosure.
Figure 2E:
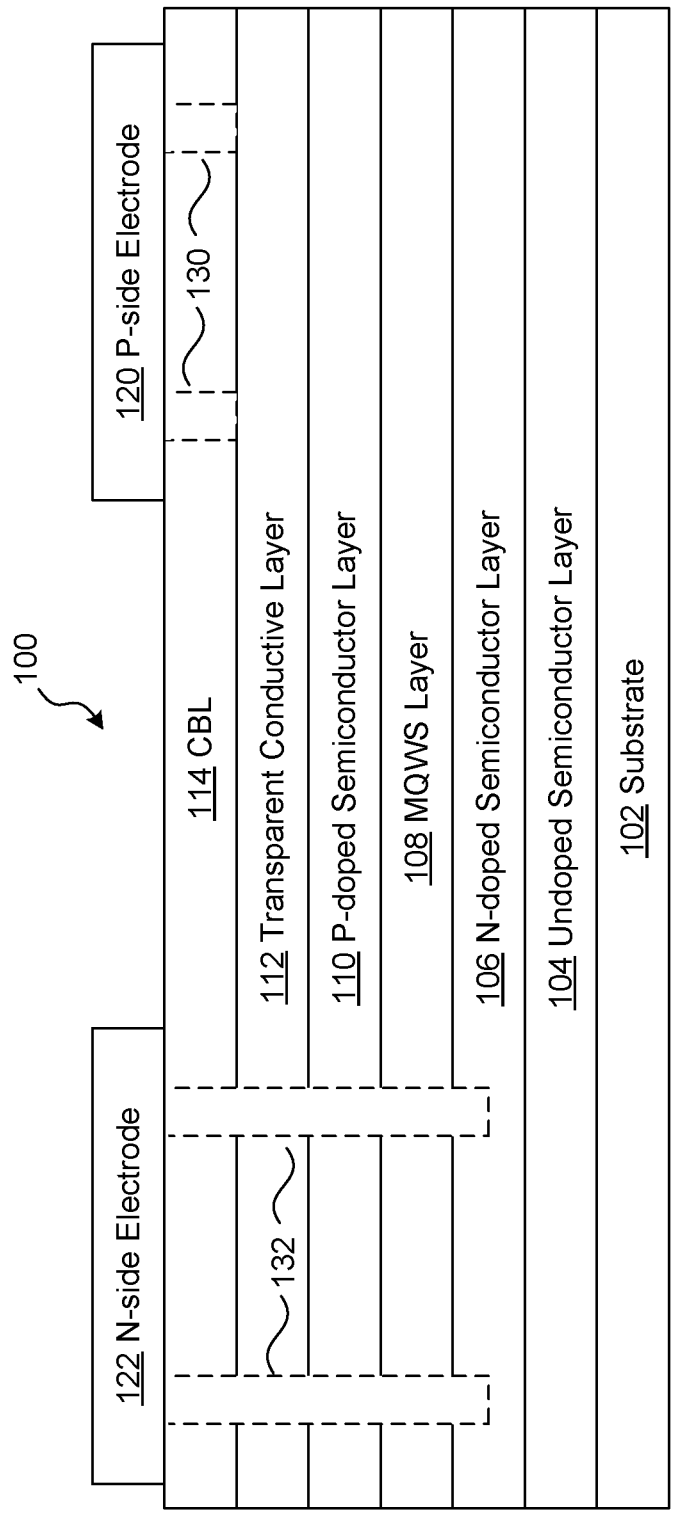
FIG. 2E schematically illustrates a stage of fabrication of an LED chip after formation of n-side electrodes and p-side electrodes, according to various embodiments of the present disclosure.

As illustrated in FIG. 2D, the materials (e.g., $SiO_2$) of the CBL 114 that cover or fill the n-electrode outflow channels 132 may be removed by, e.g., etching. In other words, the CBL materials that is on top of, or within, the n-electrode outflow channels 132 are removed. As illustrated in FIG. 2E, a p-side electrode 120 and an n-side electrode 122 of the LED chip 100 are formed on top of the CBL 114 by, e.g., vapor deposition. The p-side electrode 120 and the n-side electrode 122 may be formed of, or at least include, one or more conductive materials such as gold (Au), aluminum (Al), titanium (Ti), platinum (Pt), chromium (Cr), cadmium (Cd), copper (Cu), etc.

The p-electrode inflow channels 130 and n-electrode outflow channels 132 may be filled with, or at least include, one or more conductive materials such as gold (Au), aluminum (Al), titanium (Ti), platinum (Pt), chromium (Cr), cadmium (Cd), copper (Cu), etc. In some embodiments, the filling of the inflow and outflow channels may occur during the same process of forming the electrodes. In some other embodiments, the filling of the inflow and outflow channels may occur during a process separate from the process of forming the electrodes. In some embodiments, the electrodes 120, 122 and the channels 130, 132 include the same material. In some other embodiments, the electrodes 120, 122 and the channels 130, 132 include different materials.

The locations of the p-electrode inflow channels 130 may be distributed along the p-side electrode 120. The locations of the n-electrode outflow channels 132 may be distributed along the n-side electrode 122. In some embodiments, the number of the p-electrode inflow channels 130 equals the number of the n-electrode outflow channels 132. In some embodiments, the number of the p-electrode inflow channels 130 is different from (greater than or less than) the number of the n-electrode outflow channels 132.

In some embodiments, the fabrication process of the LED chip 100 includes three lithography step. One lithography step relates to forming the p-electrode inflow channels. Another lithography step relates to forming the n-electrode outflow channels. Yet another lithography step relates to forming the p-side and n-side electrodes. Such a fabrication process may reduce the manufacturing cost, improve chip product stability, and allow industrial mass production of the LED chips.

In some embodiments, the p-side electrode 120 may include one or more p-side electrode pads. The p-side electrode 120 may further include one or more p-side electrode fingers as extension of the p-side electrode pads. Similarly, the n-side electrode 120 may include one or more n-side electrode pads. The n-side electrode 120 may further include one or more n-side electrode fingers as extension of the n-side electrode pads.

Although various examples described and illustrated herein may refer to specific methods of fabricating LED chips, it is to be understood that the technology disclosed herein may be applied to fabrication methods that involved different steps or different arrangement or order of steps. For example, in some embodiments, an undoped semiconductor layer, an n-doped semiconductor layer, a MQWS layer, a p-doped semiconductor layer, a transparent conductive layer, and a CBL are formed on a substrate before any inflow or outflow channels are formed. Then the inflow and outflow channels are formed by, e.g., etching. Since the inflow and outflow channels are disposed across different layers, etching processes for forming the inflow channels and outflow channels may involve different etching depths.

In some embodiments, one or more etching processes disclosed herein may be inductively coupled plasma (ICP) etching. During an ICP process, a plasma is generated by inductively coupling radiofrequency power in a source while controlling an ion energy for bombarding ions onto a surface on the substrate. It is to be understood that the technology disclosed herein may include any etching techniques.

In some other embodiments, an undoped semiconductor layer, an n-doped semiconductor layer, a MQWS layer, a p-doped semiconductor layer, a transparent conductive layer, a CBL and electrodes are formed on a substrate before any inflow or outflow channels are formed. Then the inflow and outflow channels may be formed across different semiconductor layers and the electrodes. The inflow and outflow channels may be filled with e.g., one or more conductive materials such as gold (Au), aluminum (Al), titanium (Ti), platinum (Pt), chromium (Cr), cadmium (Cd), copper (Cu), etc.

It is to be understood that a chip according to embodiments of the present disclosure may include any number of p-electrode inflow channels and any number of n-electrode outflow channels. The number of p-electrode inflow channels and the number of n-electrode outflow channels may be the same or different. The p-side electrode may include any number of p-side electrode pad(s). The p-side electrode may further include any number of p-side electrode finger(s) as extension of the p-side electrode pad(s). Similarly, the n-side electrode may include any number of n-side electrode pad(s). The n-side electrode may further include any number of n-side electrode finger(s) as extension of the n-side electrode pad(s).

Figure 3:
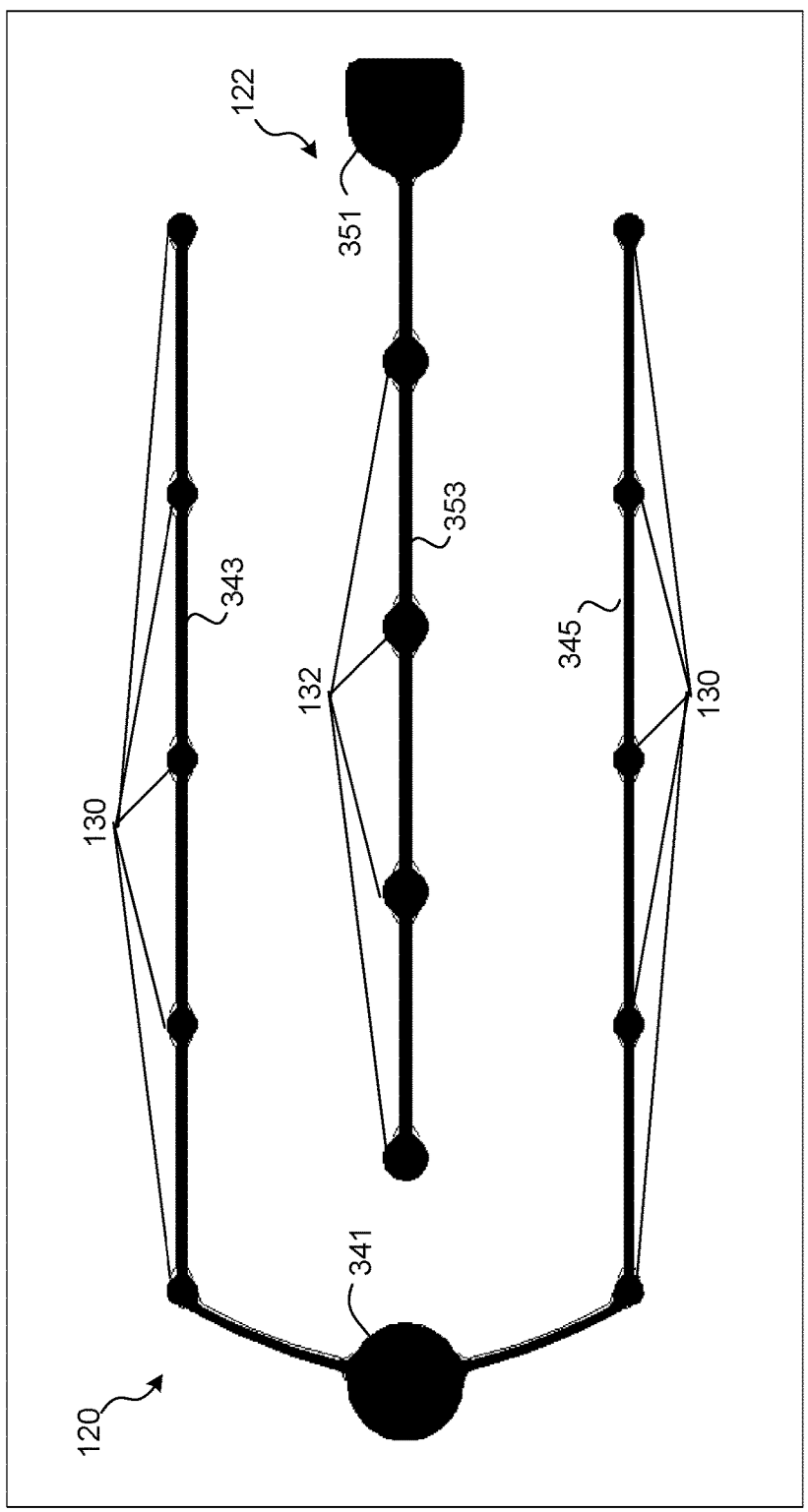
FIG. 3 schematically illustrates a top view of an example of an LED chip, according to various embodiments of the present disclosure.

For example, FIG. 3 schematically illustrates a top view of an example of an LED chip according to some embodiments of the present disclosure. The LED chip 300 includes an p-side electrode 120 and an n-side electrode 122. The p-side electrode 120 includes a p-side electrode pad 341 and p-side electrode fingers 343, 345 electrically extended from the pad 341. The n-side electrode 122 includes an n-side electrode pad 351 and an n-side electrode finger 353 electrically extended form the pad 351.

The LED chip 300 further includes 10 p-electrode inflow channels 130. 5 channels of the p-electrode inflow channels 130 are distributed evenly underneath the p-side electrode finger 343 along the extension direction of the finger 343. For example, those 5 channels of the p-electrode inflow channels 130 are distributed such that a spacing between an adjacent pair of the channels 130 is substantially the same as a spacing between another adjacent pair of the channels 130. The other 5 channels of the p-electrode inflow channels 130 are distributed evenly underneath the other p-side electrode finger 345 along the extension direction of the finger 345. Each of the p-electrode inflow channels 130 electrically interconnects the p-side electrode 120 and the transparent conductive layer (e.g., layer 112 as illustrated in FIG. 1) across the current blocking layer (e.g., CBL 114 as illustrated in FIG. 1).

The LED chip 300 further includes 4 n-electrode outflow channels 132. The 4 n-electrode outflow channels 132 are distributed evenly underneath the n-side electrode finger 353 along the extension direction of the finger 353. For example, those 4 channels of the n-electrode outflow channels 132 are distributed such that a spacing between an adjacent pair of the channels 132 is substantially the same as a spacing between another adjacent pair of the channels 132. Each of the n-electrode outflow channels 132 electrically interconnects the n-side electrode 122 and the n-doped semiconductor layer (e.g., layer 106 as illustrated in FIG. 1) across the current blocking layer, the p-doped semiconductor layer, and the MQWS layer (e.g., layers 108, 100, and 114 as illustrated in FIG. 1).

The sizes and shapes of the inflow and outflow channels and distances between the channels may vary according to various embodiments of the present disclosure. The p-electrode inflow channels may have sizes, shapes and distances that are the same as, or different from, the sizes, shapes and distances of the n-electrode outflow channels. In some embodiments, the ranges of the diameters of the p-electrode inflow channels may be, e.g., from about 0.5 µm to about 10 µm, from about 1 µm to about 20 µm, from about 1 µm to about 50 µm, or from about 1 µm to about 100 µm. The ranges of the diameters of the n-electrode outflow channels may be, e.g., from about 0.5 µm to about 10 µm, from about 1 µm to about 20 µm, from about 1 µm to about 50 µm, or from about 1 µm to about 100 µm.

In some embodiments, the ranges of the depths of the p-electrode inflow channels may be, e.g., from about 0.2 µm to about 1 µm, from about 0.1 µm to about 2 µm, from about 500 angstroms to about 5 µm, or from about 500 angstroms to about 10 µm. The ranges of the depths of the n-electrode outflow channels may be, e.g., from about 0.1 µm to about 5 µm, from about 1 µm to about 10 µm, from about 0.1 µm to about 50 µm, or from about 500 angstroms to about 50 µm.

In some embodiments, the shapes of the p-electrode inflow channels may include circles, triangle, squares, rectangles, or any other shapes. The shapes of the n-electrode outflow channels may include circles, triangle, squares, rectangles, or any other shapes. The shapes of the n-electrode outflow channels may include circles, triangle, squares, rectangles, or any other shapes.

In some embodiments, the ranges of the distances between neighboring p-electrode inflow channels may be, e.g., from about 50 µm to about 100 µm, from about 20 µm to about 120 µm, from about 10 µm to about 200 µm, or from about 1 µm to about 500 µm. The ranges of the distances between neighboring n-electrode outflow channels may be, e.g., from about 50 µm to about 100 µm, from about 20 µm to about 120 µm, from about 10 µm to about 200 µm, or from about 1 µm to about 500 µm. In some embodiments, the distances between neighboring channels may depend on the ability of spreading electrons of the transparent conducting layer.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A light-emitting diode (LED) chip, comprising:
   a semiconductor material portion;
   a transparent conductive layer disposed above the semiconductor material portion;
   a current blocking layer disposed above the transparent conductive layer;
   one or more electrodes disposed above the current blocking layer; and
   a plurality of electron outflow channels that electrically interconnect at least one electrode and the semiconductor material portion across the transparent conductive layer and the current blocking layer,
   wherein the one or more electrodes include at least one n-side electrode, and the n-side electrode includes at least one n-side electrode pad and at least one n-side electrode finger that is electrically extended from the n-side electrode pad.

2. The LED chip of claim 1, wherein the semiconductor material portion includes:
   an n-doped semiconductor layer;
   a multiple quantum wells (MQWS) layer disposed above the n-doped semiconductor layer; and
   a p-doped semiconductor layer disposed above the MQWS layer.

3. The LED chip of claim 2, wherein the electron outflow channels are n-electrode outflow channels that electrically interconnect the at least one n-side electrode and the n-doped semiconductor layer, across the transparent conductive layer, the current blocking layer, the p-doped semiconductor layer, and the MQWS layer.

4. The LED chip of claim 3, wherein the n-electrode outflow channels are evenly distributed along an extension direction of the n-side electrode finger.

5. The LED chip of claim 3, wherein the n-electrode outflow channels are configured to provide conductive paths for electrons to flow from the n-doped semiconductor layer to the n-side electrode, across the MQWS layer, the p-doped semiconductor layer, the transparent conductive layer and the current blocking layer.

6. The LED chip of claim 3, wherein the n-electrode outflow channels are configured to activate quantum wells in a region of the MQWS layer that is directly beneath the n-side electrode.

7. A light-emitting diode (LED) chip, comprising:
   a semiconductor material portion;
   a transparent conductive layer disposed above the semiconductor material portion;
   a current blocking layer disposed above the transparent conductive layer;
   one or more electrodes disposed above the current blocking layer; and
   a plurality of electron outflow channels that electrically interconnect at least one electrode and the semiconductor material portion across the transparent conductive layer and the current blocking layer,
   wherein the semiconductor material portion includes:
      an n-doped semiconductor layer;
      a multiple quantum wells (MQWS) layer disposed above the n-doped semiconductor layer; and
      a p-doped semiconductor layer disposed above the MQWS layer, wherein the one or more electrodes include at least one p-side electrode, the LED chip further comprising:

a plurality of p-electrode inflow channels that electrically interconnect the at least one p-side electrode and the transparent conductive layer, across the current blocking layer.

8. The LED chip of claim 7, wherein the p-side electrode includes at least one p-side electrode pad and at least one p-side electrode finger that is electrically extended from the p-side electrode pad, and the p-electrode inflow channels are evenly distributed along an extension direction of the p-side electrode finger.

9. The LED chip of claim 7, wherein the p-electrode inflow channels are configured to provide conductive paths for electrons to flow from the p-side electrode to the transparent conductive layer, across the current blocking layer.

10. The LED chip of claim 7, wherein the p-electrode inflow channels are configured to activate quantum wells in a region of the MQWS layer that is directly beneath the p-side electrode.

11. The LED chip of claim 1, wherein during operation of the LED chip, light generated from the semiconductor material portion propagates through the transparent conductive layer out of the LED chip.

12. The LED chip of claim 1, further comprising:
a substrate that supports the semiconductor material portion, the transparent conductive layer and the current blocking layer.

13. A face-up light-emitting diode (LED) chip, comprising:
an n-doped semiconductor layer;
a multiple quantum wells (MQWS) layer disposed above the n-doped semiconductor layer;
a p-doped semiconductor layer disposed above the MQWS layer;
a transparent conductive layer disposed above the p-doped semiconductor layer;
a current blocking layer disposed above the transparent conductive layer;
at least one p-side electrode and at least one n-side electrode disposed above the current blocking layer;
one or more p-electrode inflow channels that electrically interconnect the at least one p-side electrode and the transparent conductive layer, across the current blocking layer; and
one or more n-electrode outflow channels that electrically interconnect the at least one n-side electrode and the n-doped semiconductor layer, across the transparent conductive layer, the current blocking layer, the p-doped semiconductor layer, and the MQWS layer.

* * * * *